(12) United States Patent
Chung et al.

(10) Patent No.: US 12,727,415 B2
(45) Date of Patent: Sep. 1, 2026

(54) STEALTH PATTERNING FORMATION FOR BONDING IMPROVEMENT

(71) Applicant: Taiwan Semiconductor Manufacturing Co., Ltd., Hsinchu (TW)

(72) Inventors: Ming-Tsu Chung, Hsinchu (TW); Yung-Chi Lin, Su-Lin City (TW); Yen-Ming Chen, Chu-Pei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 370 days.

(21) Appl. No.: 18/308,266

(22) Filed: Apr. 27, 2023

(65) Prior Publication Data

US 2024/0363359 A1 Oct. 31, 2024

(51) Int. Cl.

*H10P 50/00* (2026.01)
*H10P 50/24* (2026.01)
*H10P 50/26* (2026.01)
*H10P 76/40* (2026.01)

(52) U.S. Cl.

CPC ............ *H10P 50/73* (2026.01); *H10P 50/242* (2026.01); *H10P 50/268* (2026.01); *H10P 76/4085* (2026.01)

(58) Field of Classification Search

None

See application file for complete search history.

(56) References Cited

U.S. PATENT DOCUMENTS

| | | | | |
|---|---|---|---|---|
| 7,811,945 | B2 | 10/2010 | Sasaki | |
| 11,869,869 | B2 | 1/2024 | Yu et al. | |
| 2017/0301650 | A1* | 10/2017 | Yu | H01L 24/82 |
| 2021/0066222 | A1* | 3/2021 | Chen | H01L 21/76879 |
| 2021/0242152 | A1* | 8/2021 | Fountain, Jr. | H01L 24/80 |

FOREIGN PATENT DOCUMENTS

| | | |
|---|---|---|
| TW | 200713449 A | 4/2007 |
| TW | 202243055 A | 11/2022 |

* cited by examiner

*Primary Examiner* — Stephanie P Duclair

(74) *Attorney, Agent, or Firm* — Slater Matsil, LLP

(57) ABSTRACT

A method includes forming a patterned treating mask over a first surface dielectric layer of a first package component, wherein portions of the first surface dielectric layer are exposed through the patterned treating mask, performing a selective plasma treatment on the portions of the first surface dielectric layer that are exposed through the patterned treating mask to form treated portions, removing the patterned treating mask, and bonding a second surface dielectric layer in a second package component to the first surface dielectric layer.

20 Claims, 17 Drawing Sheets

20
42PT
42
43
50
22

20
42PT
42PT
42
50
43
22

STEALTH PATTERNING FORMATION FOR BONDING IMPROVEMENT

BACKGROUND

Fusion bonding is a common bonding scheme for bonding two package components such as wafers and/or dies to each other. In the bonding process, the package components are first bonded through pre-bonding at a lower temperature, and then a bonding process is performed at a higher temperature to bond the package components together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
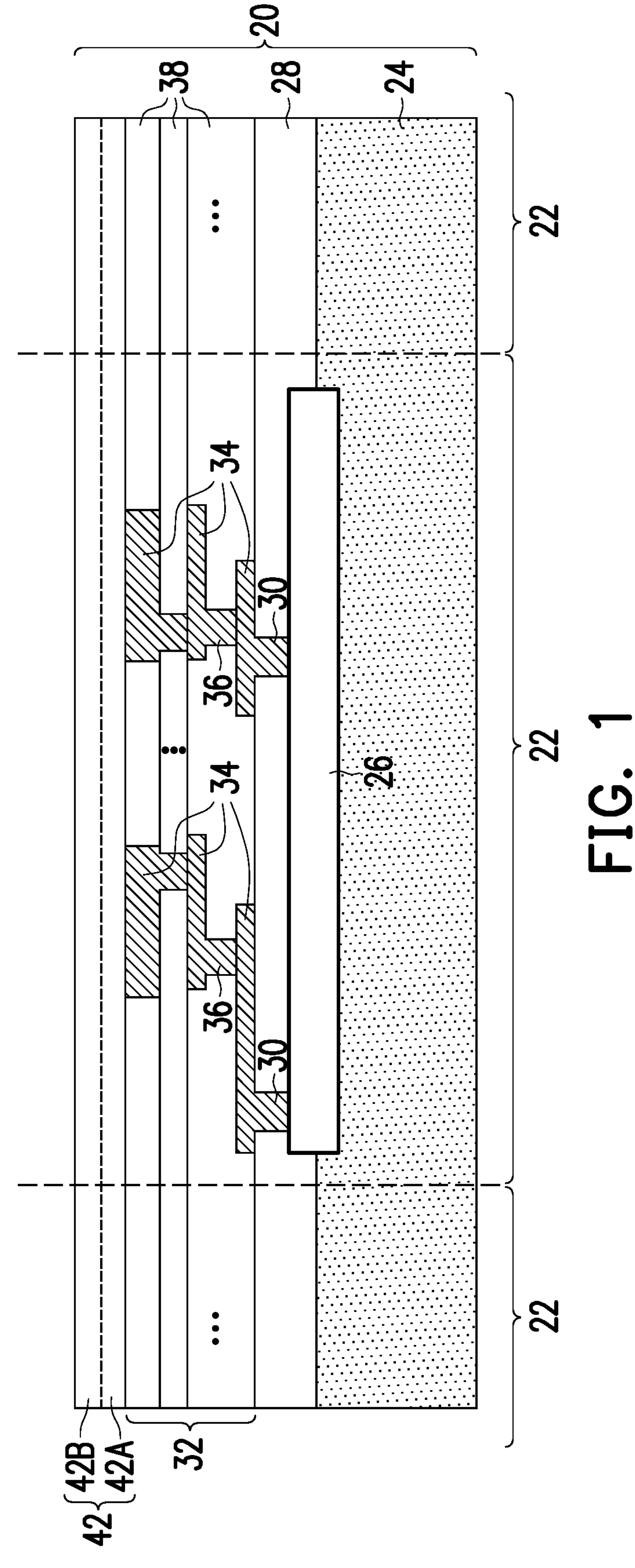
FIGS. 1-7 illustrate the cross-sectional views of intermediate stages in the formation of a package including a fusion bonding process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the package through fusion bonding are provided. In accordance with some embodiments, fusion bonding is used to bond two package components. Selected portions of the surface of one or both of the package components are treated through plasma treatment. The treatment results in the treated portions to have properties different from the untreated portions. This will change the behavior of bond wave propagation. The tiny non-bond regions that otherwise may occur are thus avoided. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 7 illustrate the cross-sectional views of intermediate stages in the formation of a package, which includes a treatment process and a bonding process in accordance with some embodiments. The corresponding processes are also reflected schematically in the process flow shown in FIG. 16.

FIG. 1 illustrates a cross-sectional view of package component 20. In accordance with some embodiments, package component 20 is or comprises a device wafer including active devices and possibly passive devices, which are represented as integrated circuit devices 26. Package component 20 may include a plurality of dies 22 therein, with the details of one of dies 22 being illustrated. In accordance with alternative embodiments, package component 20 is an interposer wafer, which is free from active devices, and may or may not include passive devices. In accordance with yet alternative embodiments, package component 20 is or comprises a package such as an Integrated Fan-Out (InFO) Package. For example, package component 20 may be a reconstructed wafer, which includes device dies and/or a wafer(s) bonded together and encapsulated in an encapsulant(s) such as molding compound. Package component 20 may also be a silicon carrier, which is free from metal features and active devices therein.

Package component 20, instead of being at wafer level, may also be at die level, and may be a device die, an interposer die, a discrete package (that has been sawed from a reconstructed wafer), or the like. In subsequent discussion, a device wafer is used as an example of package component 20, and package component 20 may also be referred to as wafer 20. The embodiments may also be applied on interposer wafers, reconstructed wafers, discrete packages, discrete device dies, discrete interposer dies, etc.

In accordance with some embodiments, wafer 20 includes semiconductor substrate 24 and the features formed at a top surface of semiconductor substrate 24. Semiconductor substrate 24 may be formed of or comprise crystalline silicon, crystalline germanium, crystalline silicon germanium, carbon-doped silicon, a III-V compound semiconductor, or the like. Semiconductor substrate 24 may also be a bulk semiconductor substrate or a Semiconductor-On-Insulator (SOI) substrate.

In accordance with some embodiments, wafer 20 includes integrated circuit devices 26, which are formed at the top surface of semiconductor substrate 24. Integrated circuit devices 26 may include Complementary Metal-Oxide Semiconductor (CMOS) transistors, resistors, capacitors, diodes, and/or the like in accordance with some embodiments. The details of integrated circuit devices 26 are not illustrated here in.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, or the like. ILD 28 may be formed using spin-on coating, Flowable Chemical Vapor Deposition (FCVD), Chemical Vapor Deposition (CVD), or the like.

Contact plugs 30 are formed in ILD 28, and are used to electrically connect integrated circuit devices 26 to overlying metal lines and vias. In accordance with some embodiments, contact plugs 30 are formed of or comprise a conductive material selected from tungsten, aluminum, copper, titanium, tantalum, titanium nitride, tantalum nitride, alloys therefore, and/or multi-layers thereof.

Interconnect structure 32 is formed over ILD 28 and contact plugs 30. Interconnect structure 32 may include metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments, interconnect structure 32 includes a plurality of metal layers interconnected through vias 36. Metal lines 34 and vias 36 may be formed of copper, a copper alloy, and/or another metal. In accordance with some embodiments, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like.

Interconnect structure 32 may also include a passivation layer, which may be formed of a non-low-k dielectric material, over the low-k dielectric layers. The passivation layer may be formed of or comprise Undoped Silicate Glass (USG), silicon nitride, silicon oxide, or the like, or multi-layers thereof. There may also be metal pads (such as aluminum-copper pads), Post Passivation Interconnect (PPI), metal pads, or the like, which are referred to as conductive features.

Further referring to FIG. 1, bond film 42 is deposited over interconnect structure 32. The top surface of bond film 42 is coplanar. Bond film 42 may be a blanket dielectric layer that is free from conductive features (such as conductive lines and conductive pads) therein. In accordance with some embodiments, an entire bond film 42 is a homogeneous layer having a uniform composition. Throughout the description, when two parts (such as two layers) are referred to as having the same composition, it means that the two parts have same types of elements, and the percentages of the corresponding elements in two parts are the same as each other. Conversely, when two parts are referred to as having different compositions, it means that one of the two parts either has at least one element not in the other part, or the two parts have the same elements, but the percentages of the elements in two parts are different from each other.

In accordance with some embodiments, bond film 42 may be formed of a silicon-base dielectric material, which may comprise one or more of oxygen, carbon, and nitrogen. Bond film 42 may be expressed as $SiO_xN_yC_z$, with x being in the range between about 0 and about 2, y being in the range between about 0 and about 1.33, and z being in the range between about 0 and about 1, and x, y, and z will not be all equal to zero. For example, bond film 42 may be formed of or comprises SiON, SiN, SiOCN, SiCN, SiOC, SiC, or the like.

In accordance with alternative embodiments, bond film 42 is a composite layer comprising two or more sub layers therein. For example, in the illustrated example, bond film 42 comprises dielectric (sub) layer 42A and dielectric (sub) layer 42B over dielectric (sub) layer 42A. Dielectric layers 42A and 42B comprise different materials with different compositions. A dashed line is drawn between dielectric layers 42A and 42B to indicate that bond film 42 may be a homogenous layer, or may include more than one layer.

Figure 2:
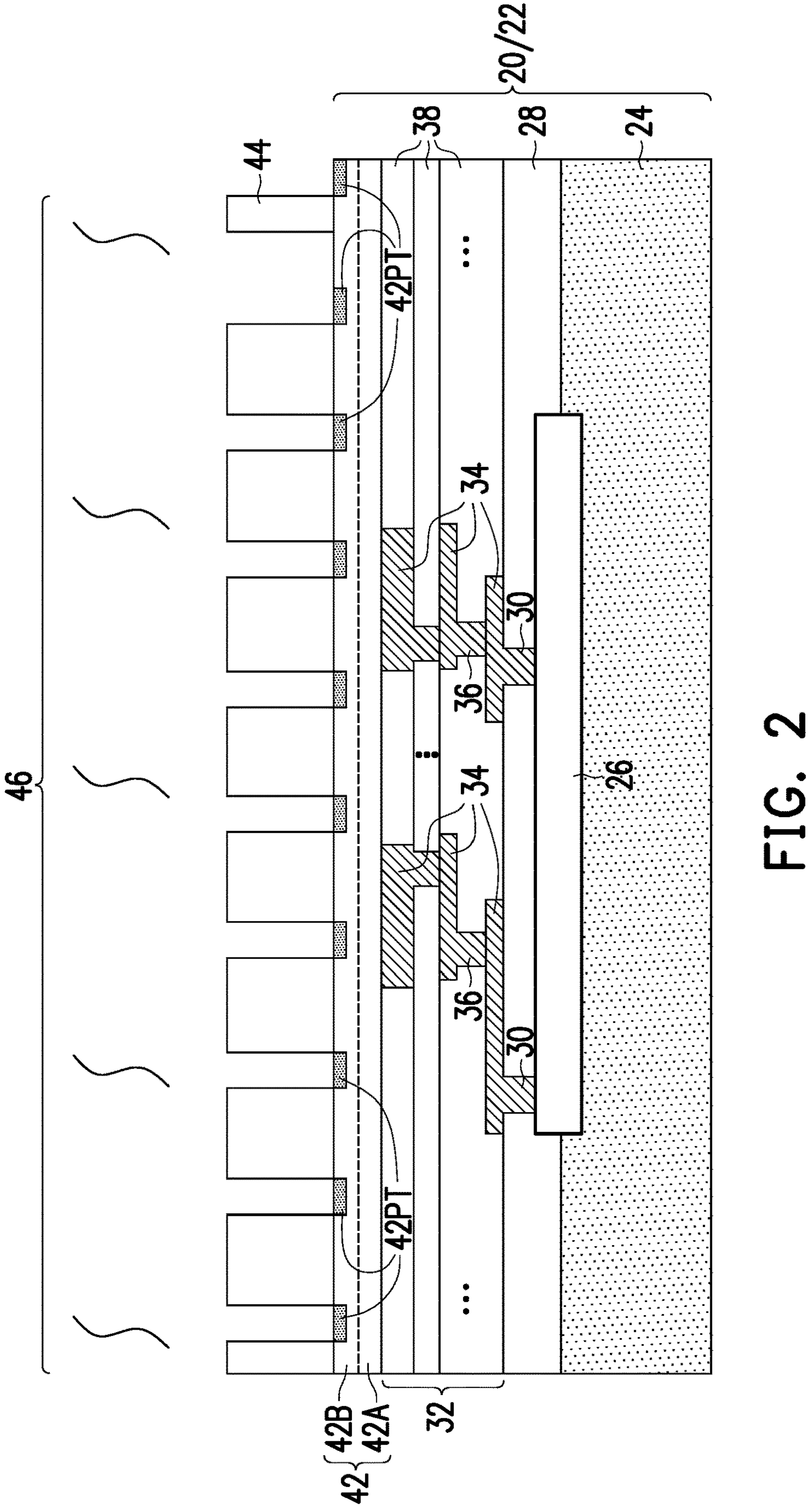
Figure 16:
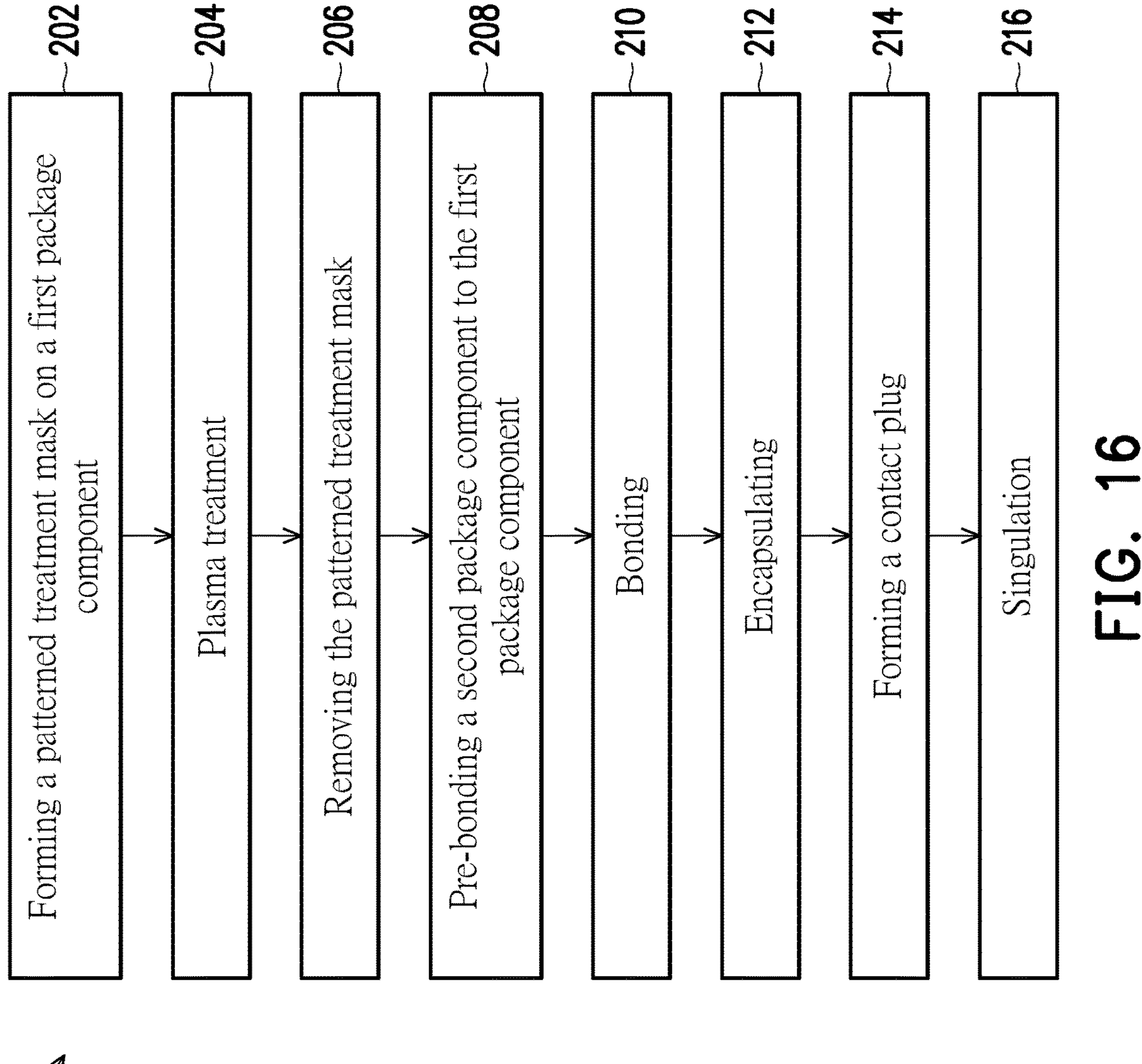
FIG. 16 illustrates a process flow for forming a package in accordance with some embodiments.

Referring to FIG. 2, a patterned treatment mask 44 is formed. The respective process is illustrated as process 202 in the process flow 200 as shown in FIG. 16. In accordance with some embodiments, the patterned treatment mask 44 comprises a photoresist. In accordance with alternative embodiments, the patterned treatment mask 44 is a tri-layer mask comprising a bottom layer, a middle layer over the bottom layer, and a photoresist over the middle layer. In accordance with yet other embodiments, the patterned treatment mask 44 comprises a hard mask formed of a material different from the material of bond film 42, and is patterned with the help of a photoresist. For example, the patterned treatment mask 44 may comprise titanium nitride, boron nitride, or the like. The material of the patterned treatment mask 44 is selected so that when it is removed in a subsequent process, bond film 42 is not damaged.

The patterned treatment mask 44 covers some portions of bond film 42, while leaving some other portions exposed. In accordance with the embodiments in which the patterned treatment mask 44 is a tri-layer, the middle layer and the bottom layer are etched using the patterned photoresist as an etching mask, so that some portions of the bond film 42 are exposed.

Further referring to FIG. 2, a selective treatment process 46 is performed. The respective process is illustrated as process 204 in the process flow 200 as shown in FIG. 16. In accordance with some embodiments, the treatment process 46 comprises a plasma treatment. The process gas for performing the plasma selective treatment process 46 may include nitrogen ($N_2$), oxygen ($O_2$), argon, He, $H_2$, $NH_3$, or the combinations thereof such as $N_2/H_2$, $H_2/He$, or $N_2/He$. The treatment time may be shorter than about 60 seconds, and may be in the range between about 10 seconds and about 60 seconds.

In accordance with some embodiments, the treatment process 46 is performed with plasma being generated locally from the process gas. The treatment may be performed with an RF power lower than about 100 watts, and may be in the range between about 50 watts and about 100 watts. In accordance with some embodiments, a small bias power is applied, with the bias power being smaller than about 200 watts or about 75 watts, such as between about 10 watts and about 200 watts. In accordance with alternative embodiments, the treatment process 46 is performed with no bias power applied. In accordance with yet alternative embodiments, the treatment process 46 is performed using remote plasma, wherein the plasma is generated in a remote chamber separate from the treatment chamber in which the selective treatment process 46 is performed, and the plasma is conducted to the treatment chamber.

The selective treatment process 46 results in the light bombardment on the exposed surface portions of bond film 42. Some bonds in bond film 42 are thus broken. The treated portions of bond film 42 are referred to as treated portions 42PT hereinafter, and the untreated portions are referred to as untreated portions 42. The treated portions 42PT may not be able to be distinguished visually from the untreated portions 42. Accordingly, the patterns of the treated portions 42PT are referred to stealth patterns. The treated portions 42PT and the untreated portions 42, however, may be distinguished from each other using tools such as X-ray Photoelectron Spectroscopy (XPS), Energy-Dispersive X-ray spectroscopy (EDX), or the like.

Figure 11:
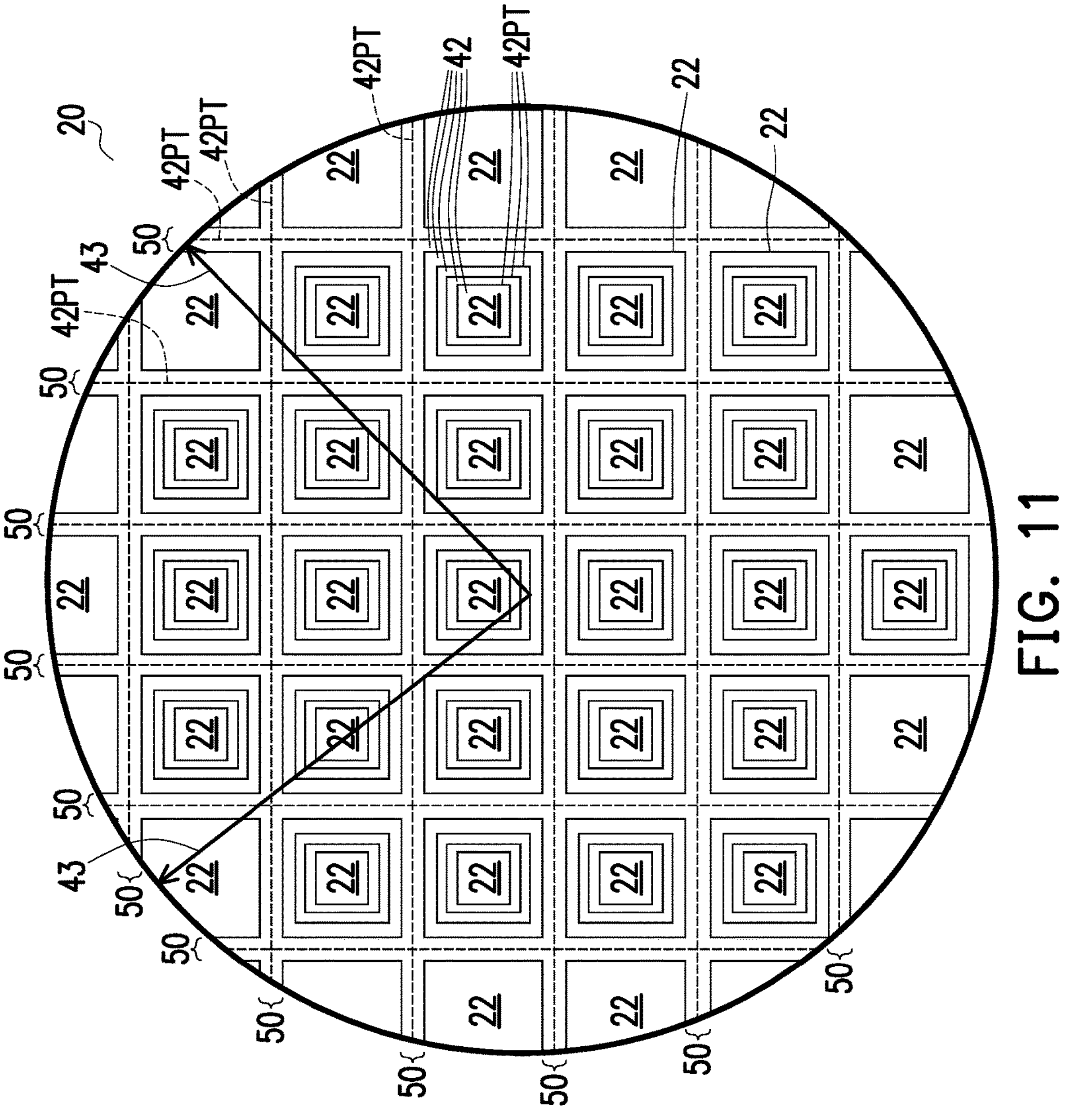
FIG. 11 illustrates a top view of a wafer, the treated patterns, and the bond wave propagation in accordance with some embodiments.

FIG. 11 illustrates a schematic top view of wafer 20 in accordance with some embodiments. Wafer 20 includes device dies 22, which are spaced apart from each other by scribe lines 50. In accordance with some embodiments, the selective treatment process 46 is performed at die level, wherein the pattern of the treated portions 42PT in each of device dies 22 is the same as the patterns of the treated portions 42PT in other device dies 22. Treated portions 42PT may be limited in device dies 22 in accordance with some embodiments. Some or all of the treated portions 42PT may be formed in scribe lines 50. For example, FIG. 11 illustrate (using dashed lines) the treated portions 42PT that are in scribe lines 50. The treated portions 42PT that are in scribe lines 50 may be formed as straight strips, which have lengthwise directions parallel to the lengthwise direction of the corresponding scribe lines 50. Each scribe line 50 may include one or more treated portions 42PT that are parallel to each other. In accordance with yet other embodiments, the treated portions 42PT are formed both in device dies 22 and in scribe lines 50.

FIGS. 12A, 12B, 12C, 12D, and 120E illustrate some example device dies 22 and the treated portions 42PT therein in accordance with some embodiments. It is appreciated that the treated portions 42PT may have any applicable pattern, providing that when the bond wave propagates, the treated portions 42PT are on the way of, and will be able to change the propagation behavior of, the bond wave, as discussed subsequently.

Figures 12A, 12B, 12C, 12D, 12E:
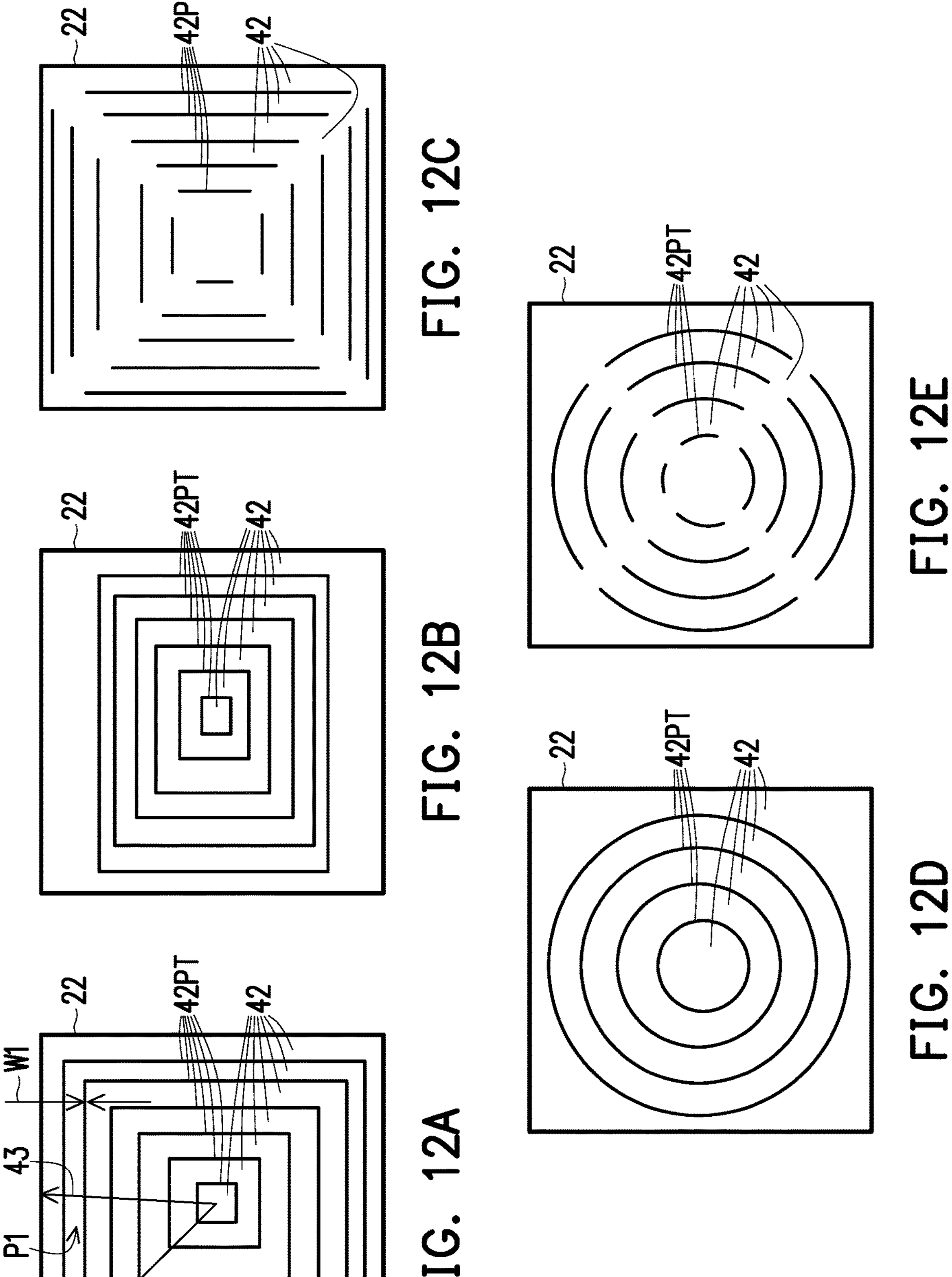
FIGS. 12A through 12E illustrate the treated patterns in device dies in accordance with some embodiments.

The treated portions 42PT may form a plurality of rings, which may be equally spaced or nonuniformly spaced, and may either have breaks therein, or having no breaks. As shown in FIG. 12A, the treated portions 42PT form a plurality of square patterns, with outer squares encircling the respective inner squares. FIG. 12B illustrates that the treated portions 42PT form a plurality of rectangular patterns, with outer rectangles encircling the respective inner rectangles. FIG. 12C illustrates that the rectangular (or square) treated portions 42PT have breaks to divide each of the rectangles into a plurality of straight strips. For example, in FIG. 12C, the treated portions are aligned to a plurality of rectangles essentially the same as shown in FIG. 12A, except that the rectangular treated portions 42PT in FIG. 12A are broken (by untreated portions) to form the pattern as shown in FIG. 12C. FIG. 12D illustrates that the treated portions 42PT form a plurality of circles. FIG. 12E illustrates that the circular treated portions 42PT have breaks to separate each of the circles into a plurality of curved strips. For example, in FIG. 12E, the treated portions are aligned to a plurality of circles essentially the same as shown in FIG. 12D, except that the circular treated portions 42PT in FIG. 12D are broken (by untreated portions) to form the pattern as shown in FIG. 12E. The treated portions 42PT may also have any other shape including, and not limited to, hexagons, octagons, triangles, or the like.

Figure 13:
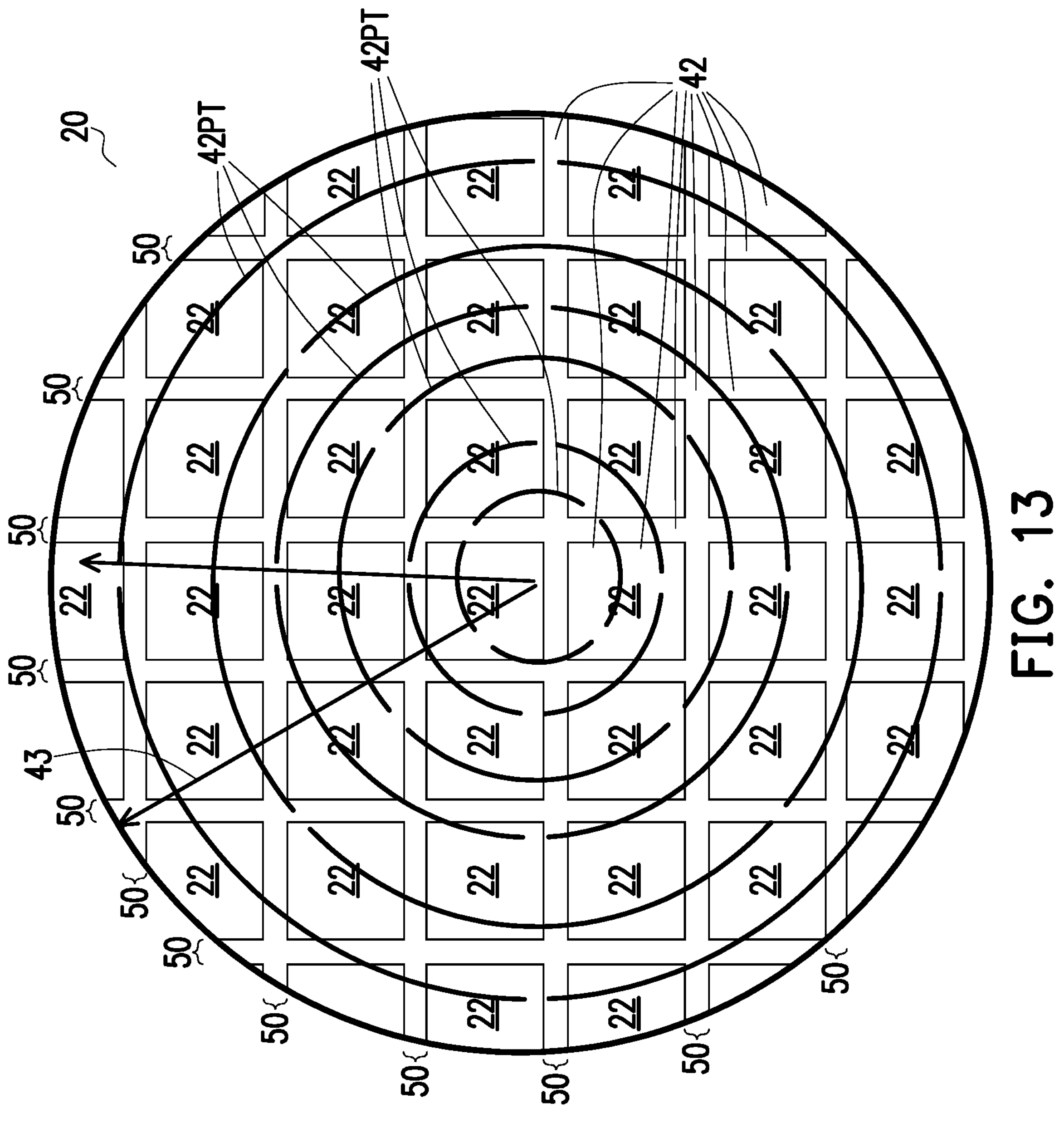
FIG. 13 illustrates the treated patterns in a wafer in accordance with some embodiments.

FIG. 13 illustrates an embodiment in which the treated portions 42PT are formed at wafer level, which is adopted when the bonding is performed through wafer-on-wafer bonding or chip-on-wafer bonding. The treated portions 42PT may have any other shape such as rings including, and not limited to, rectangles, circuits, hexagons, octagons, triangles, or the like. One or more of the treated portions 42PT may extend into a plurality of device dies 22. The illustrate treated portions 42PT may include circles, rectangles, hexagons, octagons, or the like, which patterns of treated portions 42PT may or may not have breaks therein. Furthermore, the breaks in outer rings may not be aligned to the same radius with the immediate neighboring inner rings.

Figure 3:
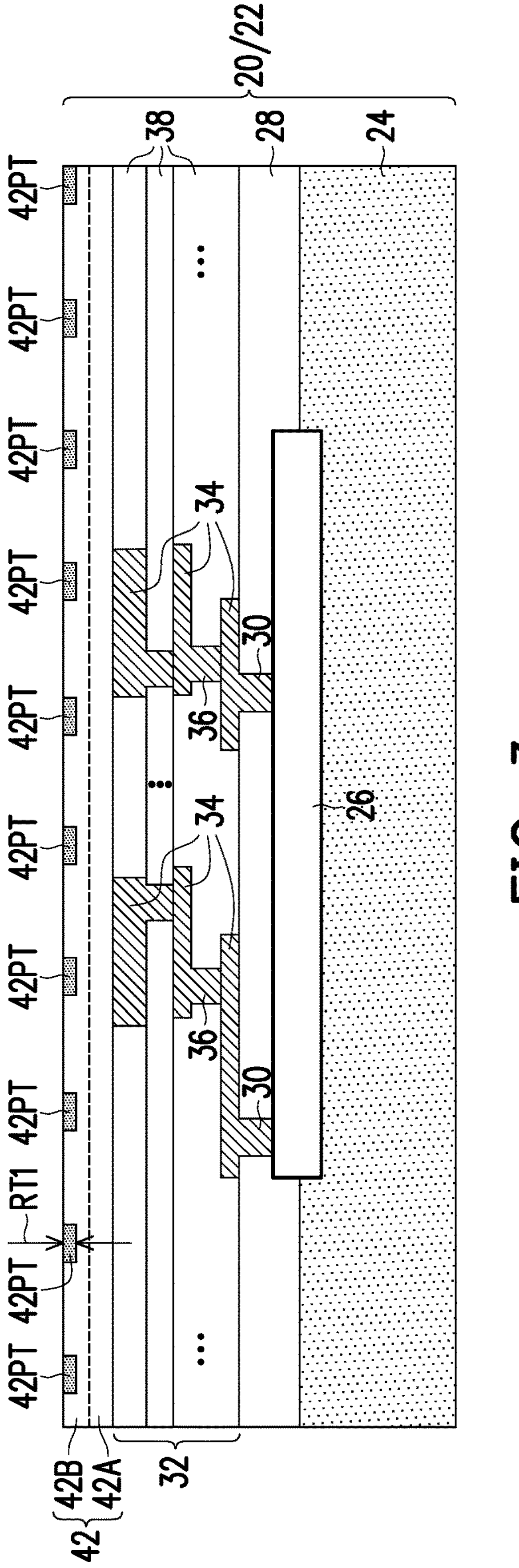

After the selective treatment, wafer 20 is taken out of the respective chamber, with vacuum break occurring. The patterned treatment mask 44 is then removed, for example, through an etching process, wherein ammonia water may be used as the etchant. The resulting wafer 20 is shown in FIG. 3. Since in the preceding treatment process, some bonds in the treated portions 42PT of bond film 42 are broken, dangling bonds are formed. These dangling bonds may react with oxygen or moisture in the air to form an oxide. As a result, the treated portions 42PT have an oxygen atomic percentage $OAP_{42PT}$ higher than the oxygen atomic percentage $OAP_{42}$ in the untreated portions 42.

At the time the wafer 20 is subsequently bonded to package component 120, the top surfaces of the treated portions 42PT may be coplanar with the top surfaces of the untreated portions 42. Alternatively, the top surfaces of the treated portions 42PT are substantially coplanar with the top surfaces of the untreated portions 42. For example, the top surfaces of treated portions 42PT may be slightly higher than the top surfaces of the untreated portions 42 by a small height difference, which may be smaller than about 2 Å or smaller than about 1 Å. The treated portions 42PT, which may be oxide rich (having a higher oxygen atomic percentage than the untreated portions) may have a thickness RT1 smaller than about 100 Å, and may be in the range between about 40 Å and about 100 Å.

Figure 4:
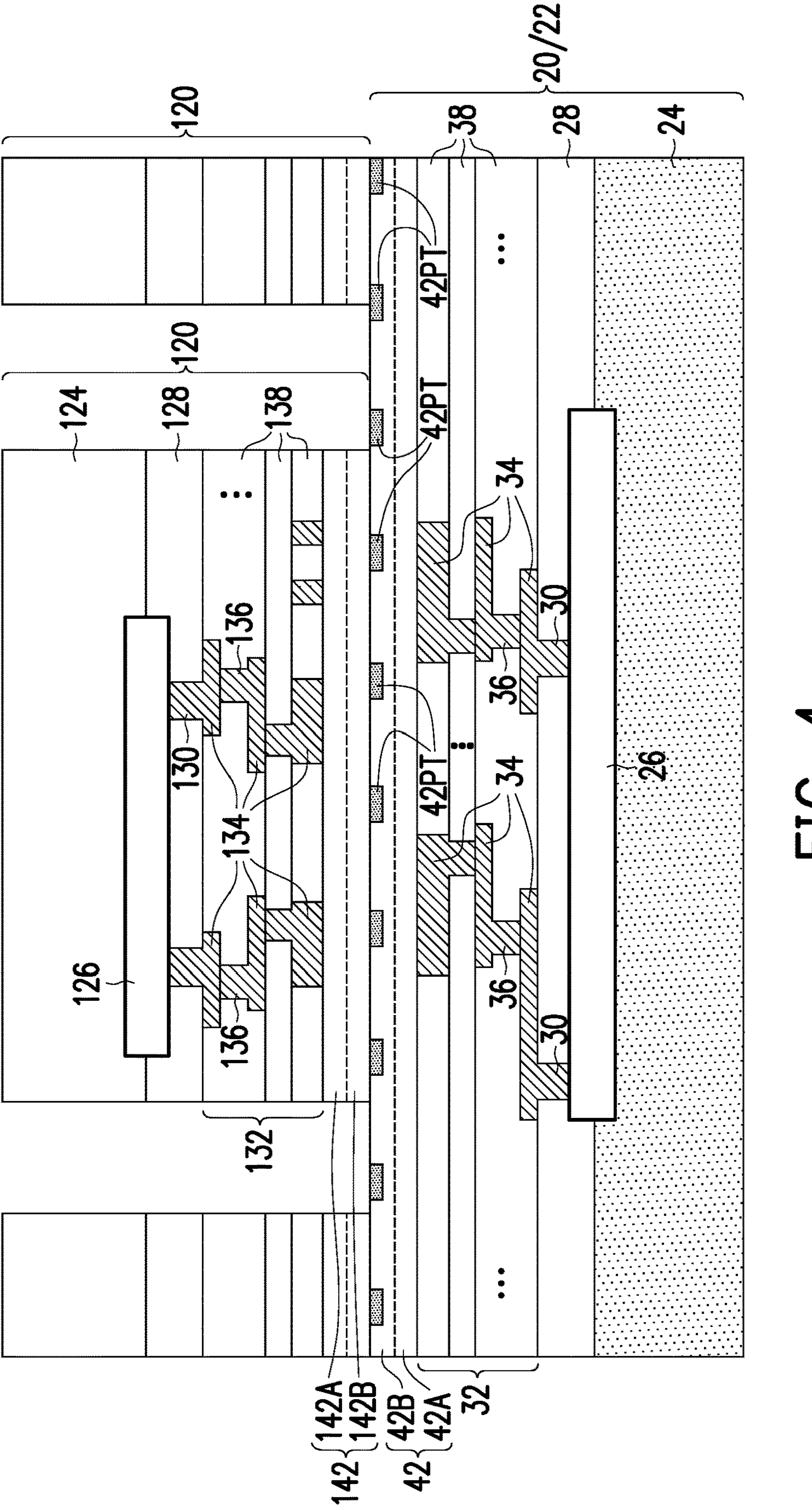

Referring to FIG. 4, package component 120 is formed, and is aligned to and placed on the device dies 22 in wafer 20. In accordance with some embodiments, package component 120 is a device die, an interposer die, a package, or the like. Alternatively, package component 120 may be a device wafer, an interposer wafer, a reconstructed wafer including bonded device dies therein, or the like. FIG. 4 illustrates a device die as an example.

In some example embodiments, package component 120 has a similar structure as that of package component 120. The structures and the materials of the features in package component 120 may be found referring to the like features in wafer 20, with the like features in package component 120 being denoted by adding number "1" in front of the reference numbers of the corresponding features in wafer 20. For example, the substrate in wafer 20 is denoted as 24, and accordingly, the substrate in package component 120 is denoted as 124. Package component 120 may include integrated circuit devices 126, ILD 128, contact plugs 130, interconnect structure 132, dielectric layers 138, metal lines 134, and vias 136. The details of these features may be similar to the corresponding features in wafer 20, and are not repeated herein.

Package component 120 further includes bond film 142 at a surface. Bond film 142 may be a single layer formed of a homogeneous dielectric material, or may be a composite layer including a plurality of dielectric layers (such as 142A and 142B) formed of different dielectric materials with different compositions. The material of bond film 142 may be selected from the same candidate materials for forming bond film 42 (and dielectric layers 42A and 42B).

Figure 8:
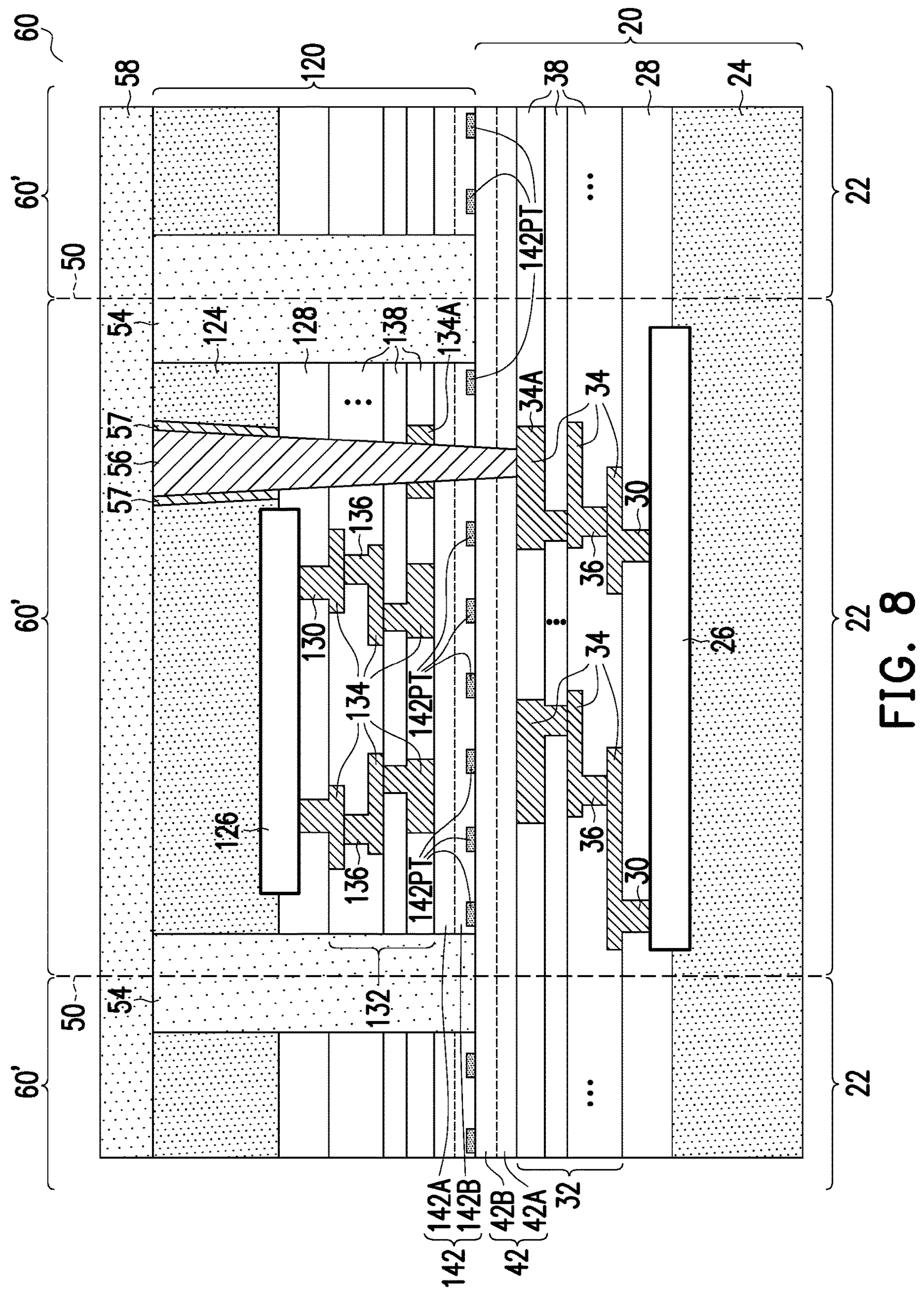
FIGS. 8-10 and 10A illustrate the cross-sectional views of some packages in accordance with some embodiments.
Figure 9:
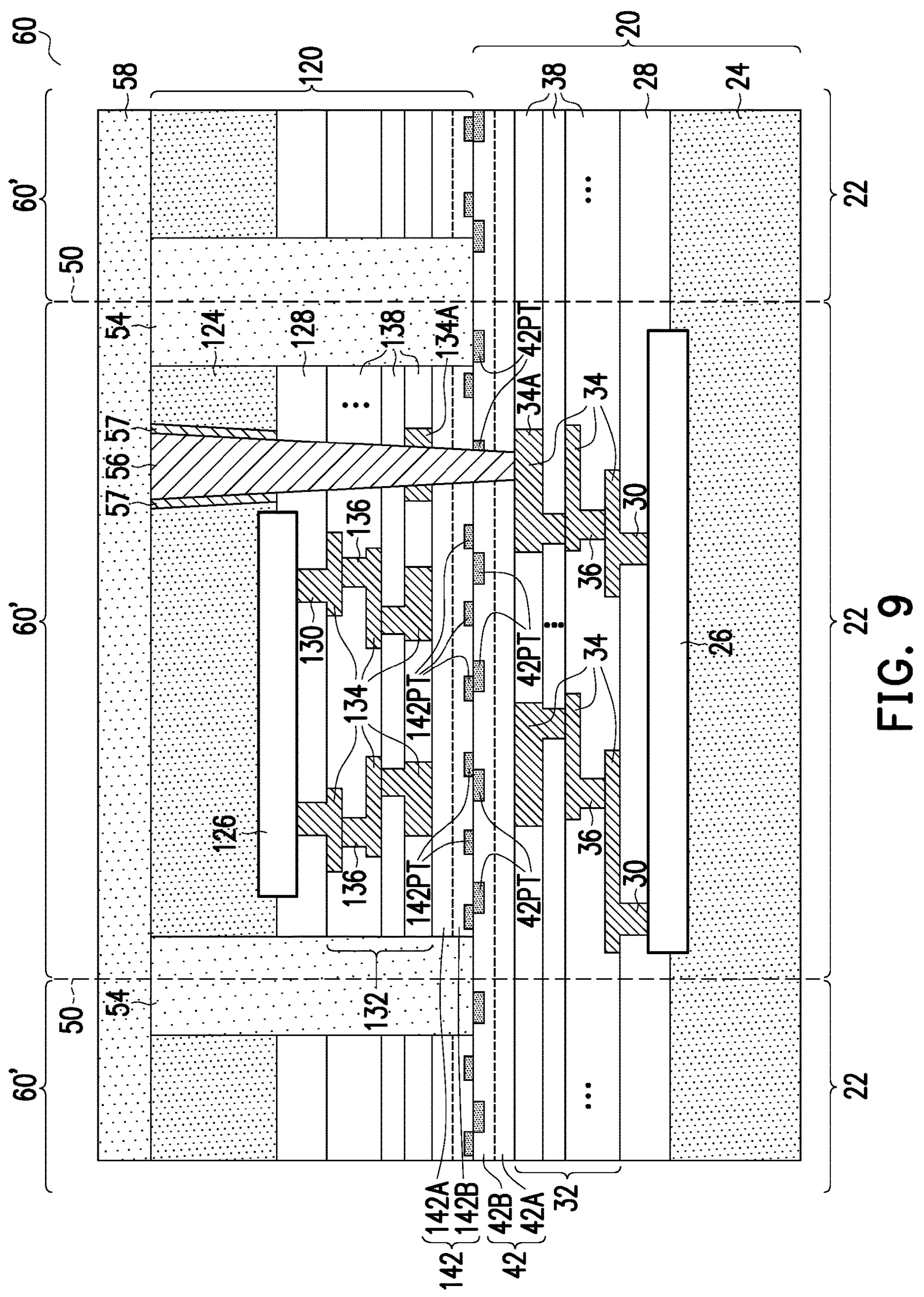
Figure 10:
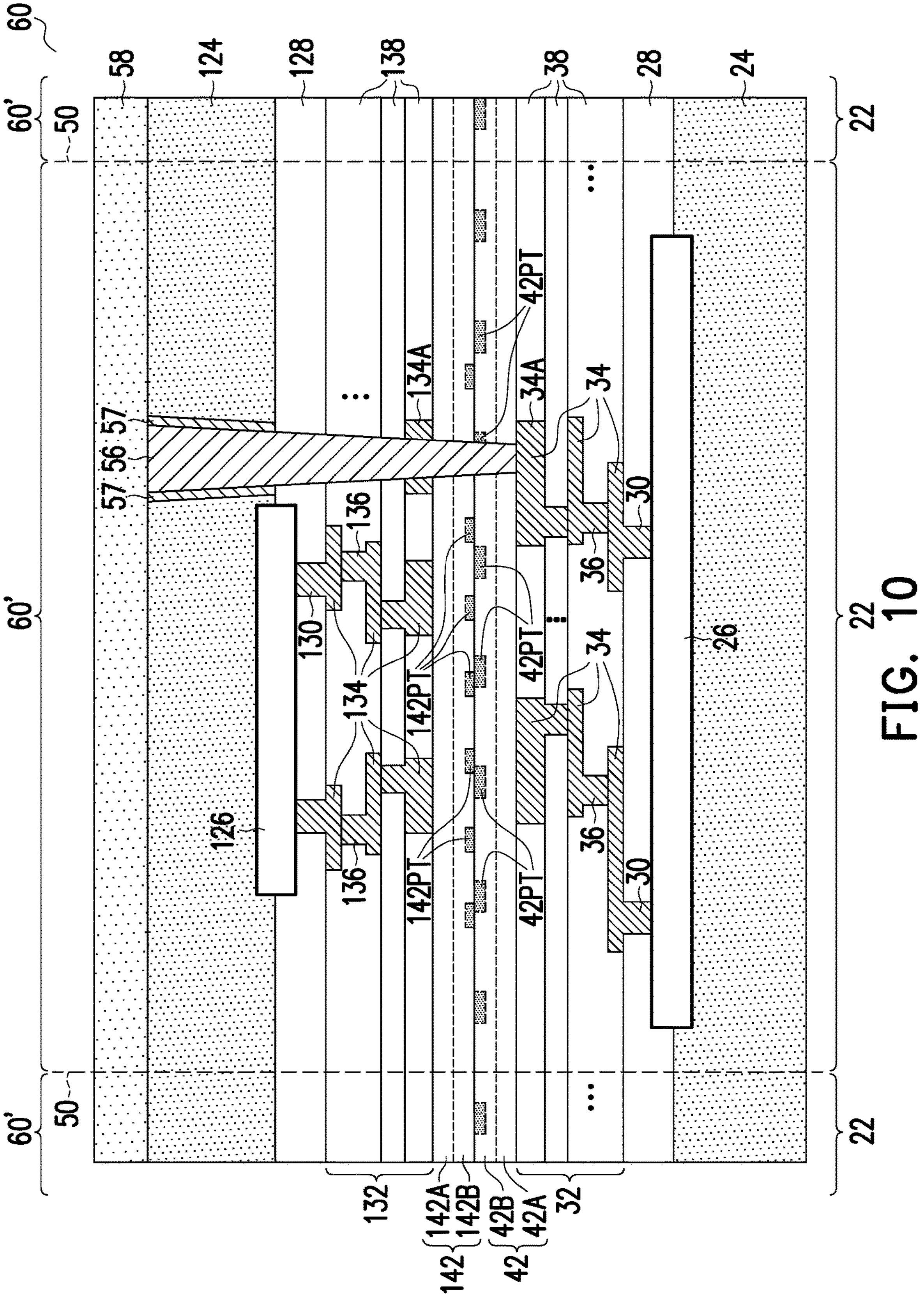

In accordance with some embodiments, there is no selective treatment process performed on bond film 142. In accordance with alternative embodiments, bond film 142 is also treated through a selective treatment process. The selective treatment process may be performed using a method selected from the same group of candidate methods as selective treatment process 46. The selective treatment process may also be performed using a process gas selected from the same group of candidate process gases as selective treatment process 46. The resulting structure is shown in FIGS. 8 through 10, as will be discussed in subsequent paragraphs.

In accordance with some embodiments, the surface of bond film 42 is activated in an activation process, for example, through a treatment process performed in a forming gas comprising $N_2$ and $H_2$. The selective treatment process 46 may be performed before or after the activation process. The selective treatment process 46 may also be performed using the forming gas comprising $N_2$ and $H_2$.

FIG. 4 illustrates a pre-bonding process. The respective process is illustrated as process 208 in the process flow 200 as shown in FIG. 16. In accordance with some embodiments, during the pre-bonding, package component 120 is put into contact with wafer 20, with a pressing force applied to press package components 20 and 120 against each other. The pre-bonding may be performed at room temperature (between about 20° C. and about 25° C.), and a higher temperature may also be used.

The pre-bonding may start from putting the center of package component 120 into contact with wafer 20. The contacting propagates from the contacting point to the edges of package components 20 and 120, which propagation generates a bond wave propagating from the contacting point to the edges. Arrows 43 in FIGS. 11, 12A and 3 illustrate the direction of the bond wave propagation. With the bond wave propagating from the contacting point to the edges, the air between package components 20 and 120 is gradually squeezed out, so that no air bubble or moisture is trapped between package components 20 and 120.

During the propagation of the bond wave, Joule-Thomson effect may occur, wherein the temperature of some portions of package components 20 and 120 may drop, and moisture may condense on the low-temperature surface. This will cause some tiny non-bond regions to occur. If the bonded surfaces of the bond films 42 and 142 are isotropic, the Joule-Thomson effect tends to occur. When the selective treatment process 46 is performed, the surface of the corresponding bond film 42 (and/or bond film 142) includes treated portions 42PT and untreated portions 42, which have different compositions and different properties. The bond wave travels through the treated portions 42PT and untreated portions 42 at different speed. Accordingly, the bond wave propagation is disrupted and discontinuous when running into the treated portions. The Joule-Thomson effect is reduced, and the tiny non-bond regions are at least reduced, and possibly eliminated.

In accordance with some embodiments, to effectively disrupt the bond wave, the sizes and the pitches of the treated portions 42PT are selected, so that the disruption of the bond wave is effective. FIG. 12A illustrates the widths and pitches of the treated portions 42PT in accordance with some embodiments. The widths W1 of the treated portions 42PT, which may be equal to each other or different from each other, may be in the range between about 1 μm and about 20 μm. The pitches P1 of the treated portions 42PT, which may also be equal to each other or different from each other, may be in the range between about 1 μm and about 100 μm. The total area of the treated portions 42PT may be less than about 15 percent, and may be in the range between about 5 percent and about 10 percent, the total area of the respective chip or wafer.

A plurality of package components 120 may be pre-bonded to wafer 20. After the pre-bonding, an annealing process is performed, for example, with Si—O—Si bonds being formed between bond films 42 and 142, so that bond films 42 and 142 are bonded to each other. The respective process is illustrated as process 210 in the process flow 200 as shown in FIG. 16. In accordance with some embodiments, the annealing process is performed at a temperature in the range between about 250° C. and about 300° C. The annealing duration may be in the range between about 5 minutes and about 30 minutes in accordance with some embodiments.

Figure 5:
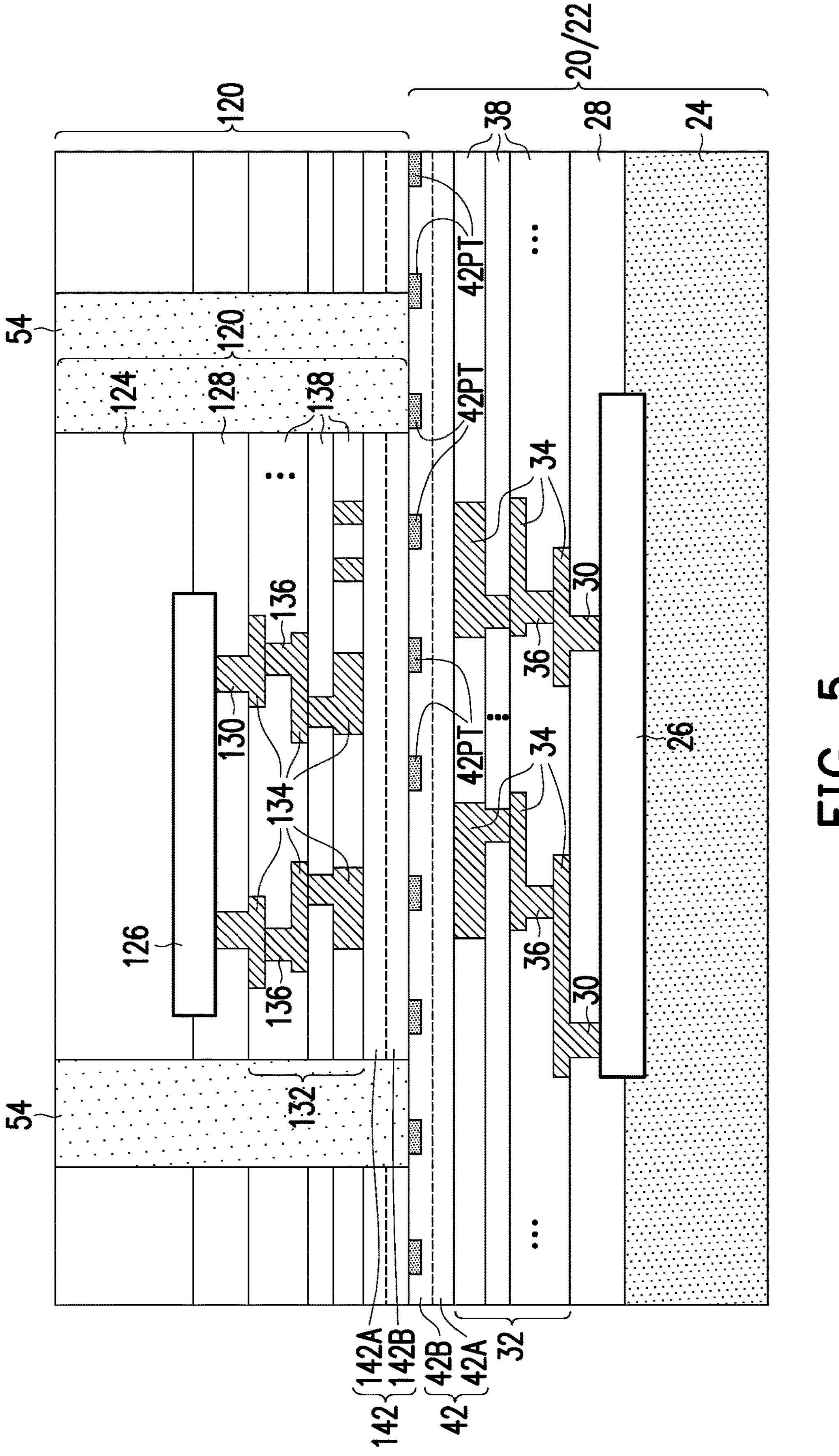

Referring to FIG. 5, package components 120 are encapsulated in an encapsulant 54 (dielectric gap-filling regions). The respective process is illustrated as process 212 in the process flow 200 as shown in FIG. 16. In accordance with some embodiments, encapsulant 54 may comprise a dielectric liner and a dielectric filling material on the dielectric liner. The dielectric liner may be formed of or comprise silicon nitride, while the dielectric filling material may comprise silicon oxide. Alternatively, encapsulant 54 may comprise a molding compound, an epoxy, a resin, and/or the like. A planarization process such as a CMP process is performed to level the top surface of encapsulant 54 with the top surfaces of package components 120.

In accordance with some embodiments, some of the treated portions 42PT may be in the regions not bonded to any of package components 120. Accordingly, encapsulant 54 may be in physical contact with the top surfaces of either one, or both, of the treated portions 42PT and untreated portions 42.

Figure 6:
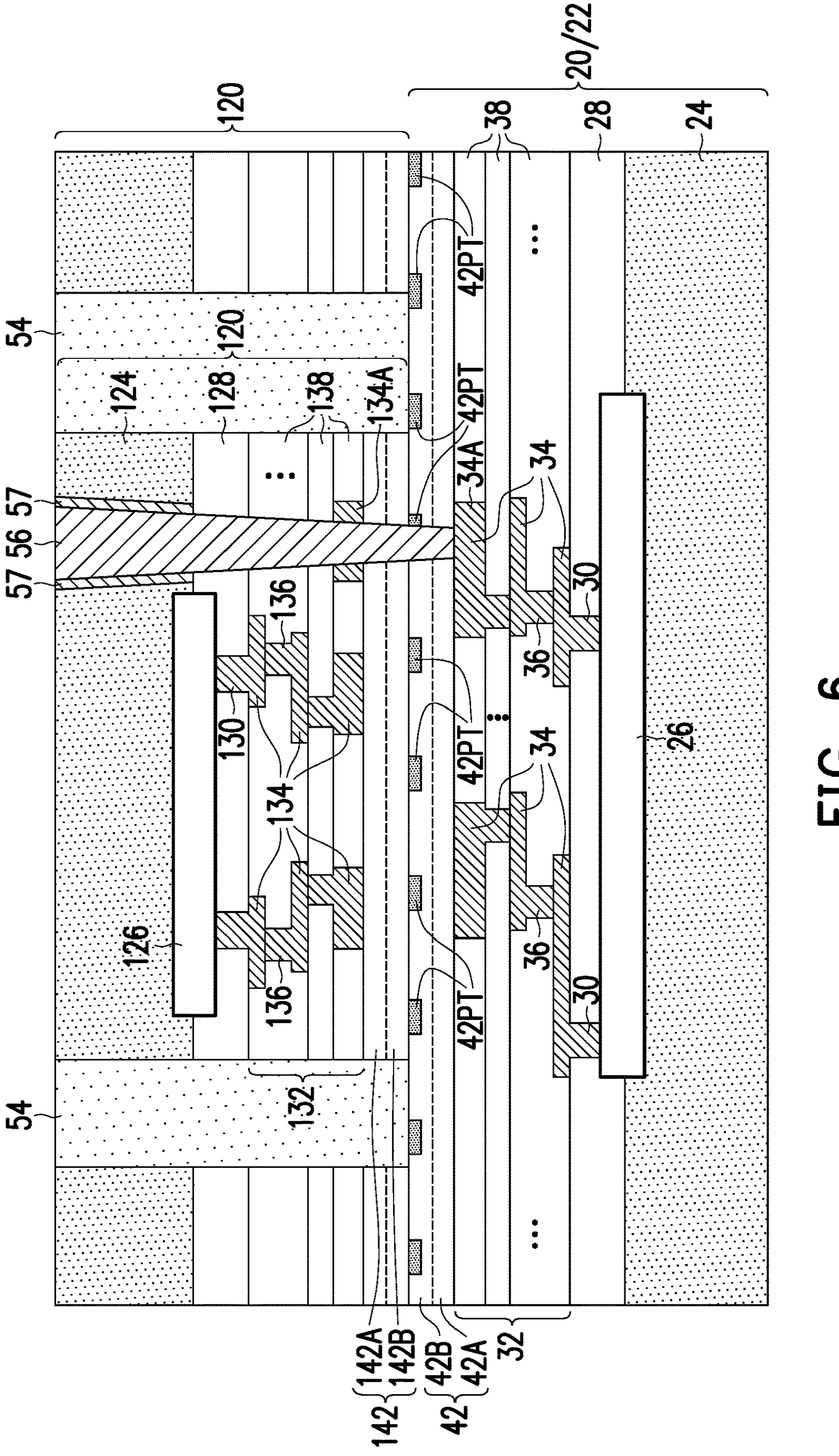

FIG. 6 illustrates an example embodiment in which contact plug 56 is formed to penetrate through package component 120, and electrically connects metal pad 134A in package component 120 to metal pad 34A in wafer 20. The respective process is illustrated as process 214 in the process flow 200 as shown in FIG. 16. Contact plug 56 lands on metal pad 34A of wafer 20. Contact plug 56 penetrates through bond films 42 and 142, and may penetrate through and contact the treated portions 42PT and untreated portions 42. A dielectric isolation ring 57 may be formed to electrically insulate contact plug 56 from semiconductor substrate 124.

Figure 7:
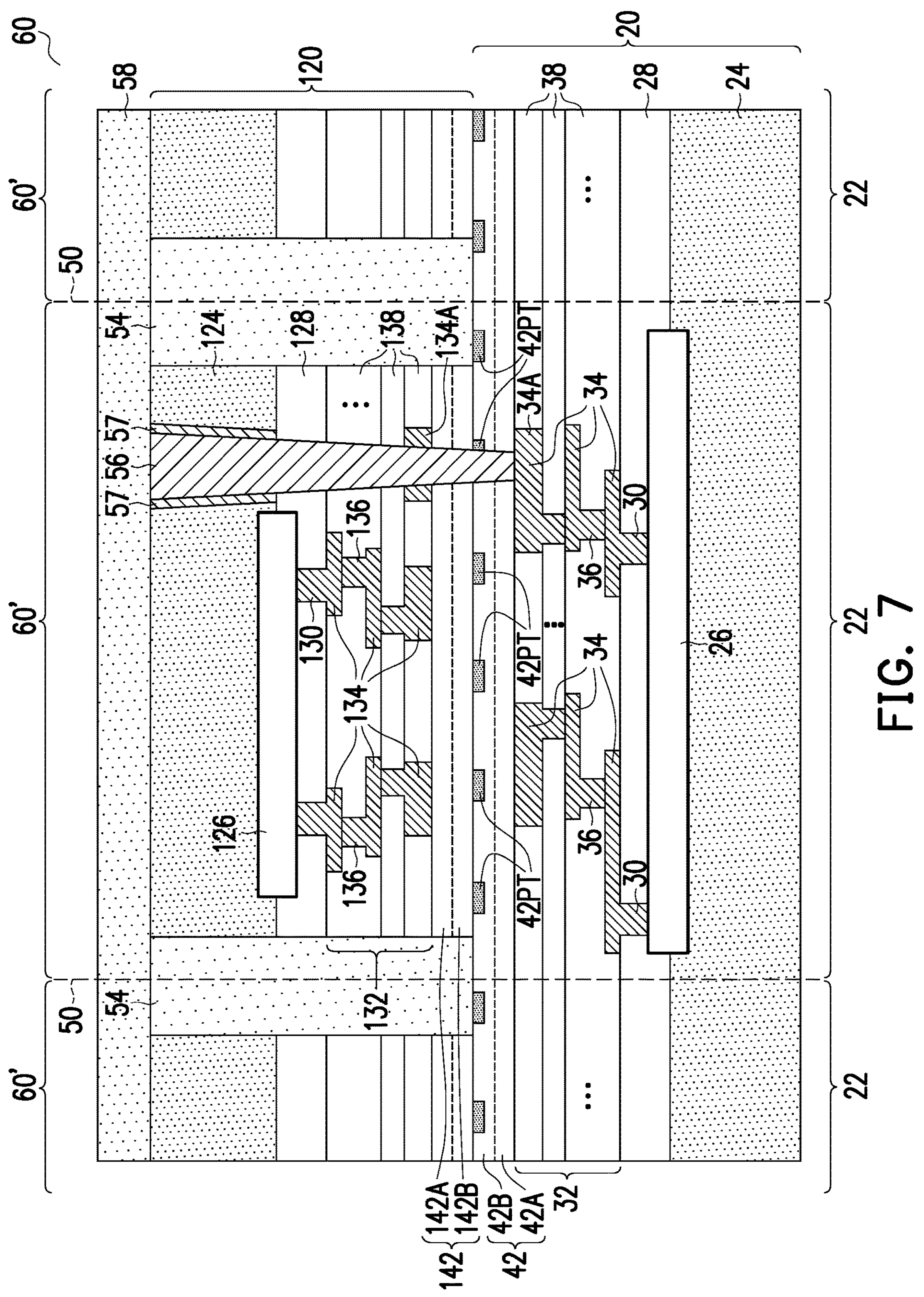

Referring to FIG. 7, dielectric layer 58 may be formed to cover contact plug 56 and substrate 124. Reconstructed wafer 60 is thus formed. A singulation process may then be performed along scribe lines 50 to saw reconstructed wafer 60 and to form packages 60'. The respective process is illustrated as process 216 in the process flow 200 as shown in FIG. 16. Each of the packages 60' may include a package component 22 (such as a device die) bonded to package component 122 (such as a device die).

FIG. 8 illustrates the formation of reconstructed wafer 60 and packages 60' in accordance with alternative embodiments. The formation processes, structures, and materials of these embodiments are similar to the embodiments in FIGS. 1 through 7, except that the selective treatment process 46, instead of being performed on wafer 20, is performed on package components 120. Accordingly, the surface dielectric layers 142 in package components 120 have treated portions 142PT and untreated portions 142. The details for selective treating surface dielectric layers 142 may be essentially the same as the selective treatment process 46.

FIG. 9 illustrates the formation of reconstructed wafer 60 and packages 60' in accordance with alternative embodiments. The formation processes, structures, and materials of these embodiments are similar to the embodiments in FIGS. 1 through 7, except that the selective treatment is performed on both of wafer 20 and package components 120. In accordance with these embodiments, each of the treated portions 142PT and untreated portions 142 may be bonded to any of treated portions 42PT and untreated portions 42 in any combination, depending on the sizes and the locations of the treated portions and the untreated portions.

Figure 10A:
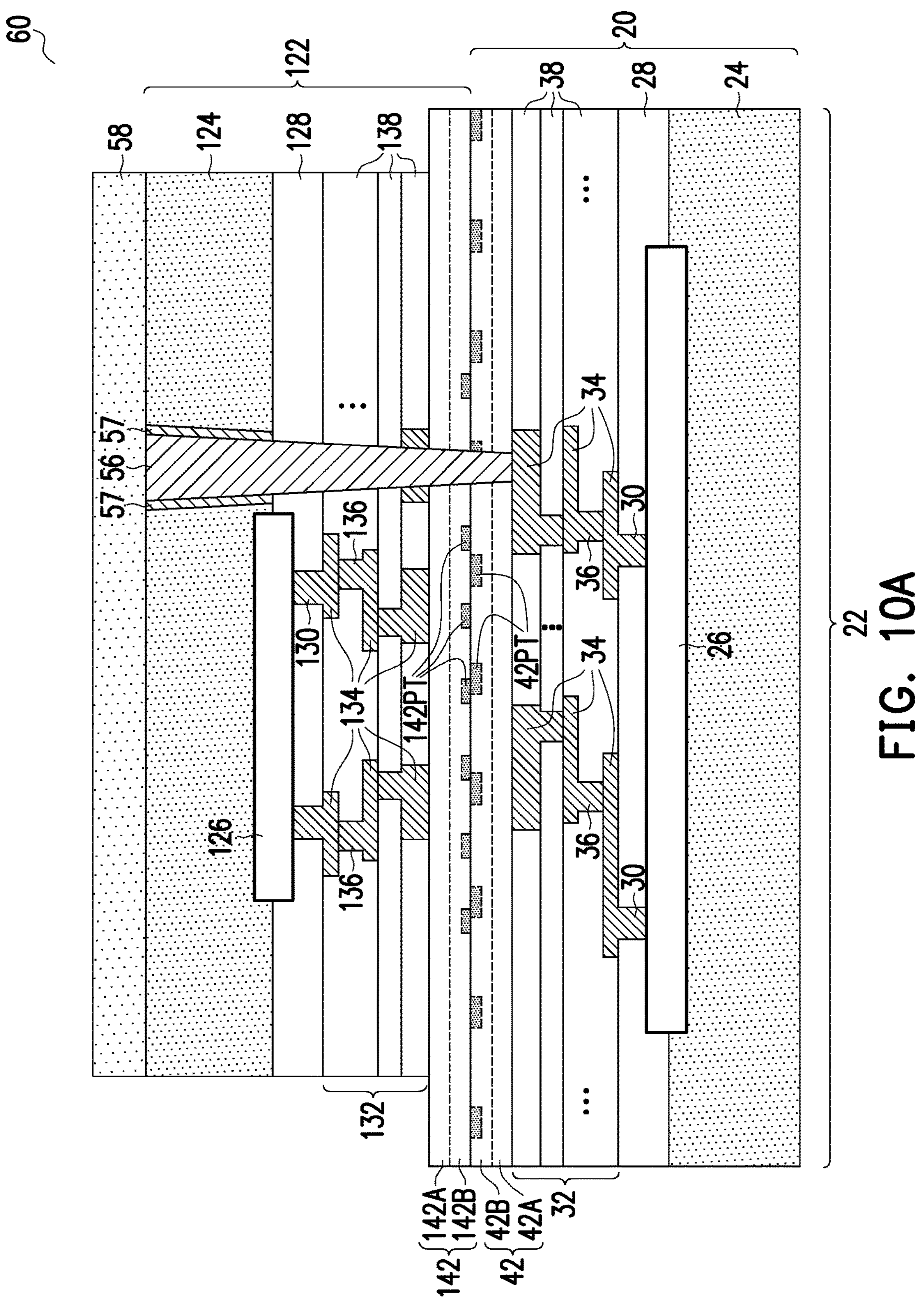

FIG. 10 illustrates the formation of reconstructed wafer 60 and packages 60' in accordance with alternative embodiments. The formation processes, structures, and materials of these embodiments are similar to the embodiments in FIGS. 1 through 7, except that instead of chip-on-wafer bonding, wafer-on-wafer bonding is performed, with wafer 120" being bonded to wafer 20. The selective treatment process may be performed on either one or both of wafers 20 and 120". When the selective treatment is performed on both of wafers 20 and 120", each of the treated portions 142PT and untreated portions 142 may be bonded to any of treated portions 42PT and untreated portions 42 in any combination, depending on the sizes and the locations of the treated portions and the untreated portions. FIG. 10A illustrates an embodiment in which chip-on-chip bonding is performed, wherein chip 122 is bonded to chip 22.

As addressed above, the selective treatment results in the treated portions to have a composition different from the composition of the untreated portions. The oxygen atomic percentage $OAP_{42PT}$ of the treated portions 42PT may be higher than the oxygen atomic percentage $OAP_{42}$ of the untreated portions 42. The difference ($OAP_{42PT}$–$OAP_{42}$) may be greater than about 2 percent, and may be in the range between about 2 percent and about 4 percent.

In accordance with the embodiments in which non-oxygen process gases such as $N_2$ and/or Ar are used for the selective treatment process 46, the atomic percentage of the non-oxygen element in the process gas may not have noticeable increase, and may even drop, in the treated portions 42PT than in the untreated portions 42. For example, if $N_2$ is used to perform the selective treatment process 46, the nitrogen atomic percentage $NAP_{42PT}$ in the treated portions 42PT may be equal to or lower than the nitrogen atomic percentage $NAP_{42}$ in the untreated portions 42.

Figure 14:
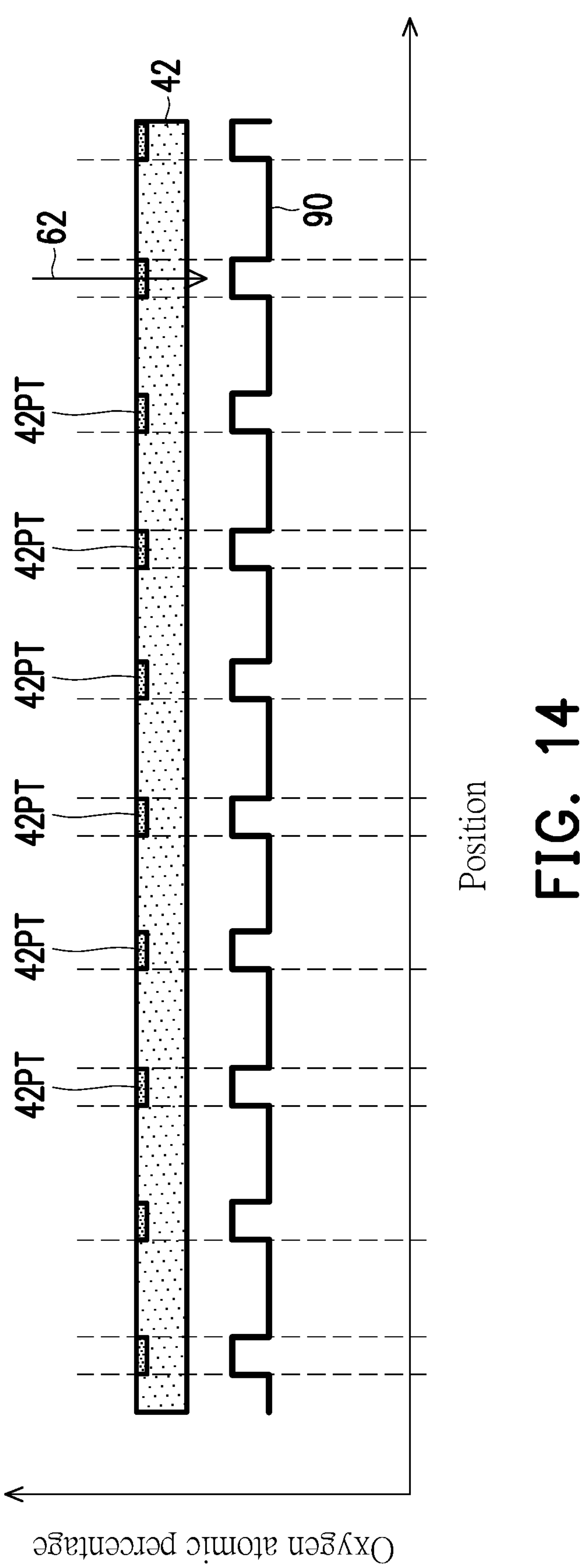
FIGS. 14 and 15 illustrate some oxygen distribution patterns in treated portions and neighboring untreated portions in accordance with some embodiments.

FIG. 14 schematically illustrates the oxygen atomic percentages in the treated portions 42PT as a function of their positions. The surface portion of bond film 42 is also shown in FIG. 14 to correspond the positions of the treated portions 42PT and untreated portions 42 to their oxygen atomic percentages. FIG. 14 illustrates line 90 to represent the oxygen atomic percentages. FIG. 14 shows that the oxygen atomic percentages in the treated portions 42PT are higher than the oxygen atomic percentages in the untreated portions 42.

Figure 15:
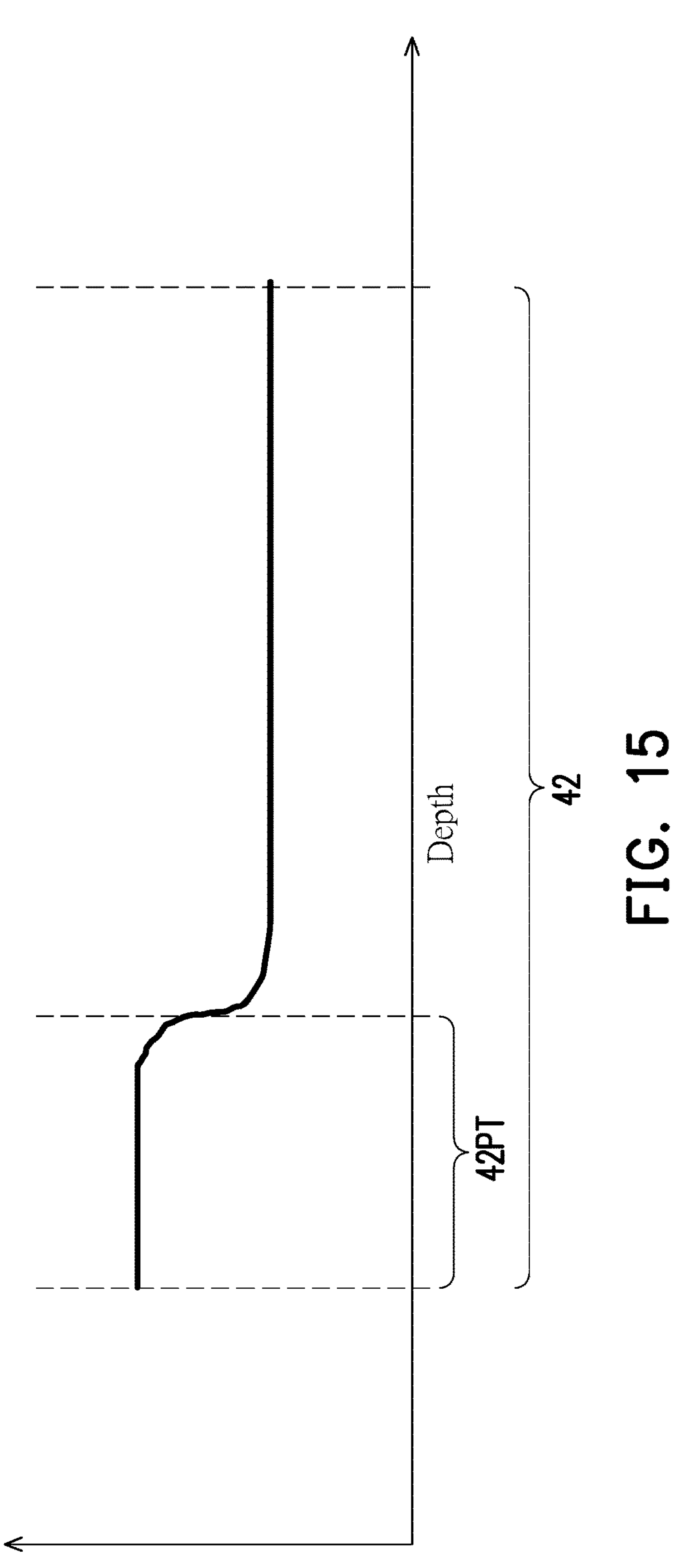

FIG. 15 schematically illustrates the oxygen atomic percentage in the treated portions 42PT as a function of their depths into bond film 42. The X-axis represents the position in the direction of arrow 62 in FIG. 14. It also shows that the treated portions 42PT have higher oxygen atomic percentages, while the untreated portions 42PT have lower atomic percentages. The difference in the composition may be found using XPS, EDX, or the like.

The embodiments of the present disclosure have some advantageous features. By selectively treating some, but not all portions of the surface dielectric layers that are to be bonded through fusion bonding, the Joule-Thomson effect is reduced, and the tiny non-bond issue is at least alleviated, or may be eliminated.

In accordance with some embodiments, a method comprises forming a treating mask over a first surface dielectric layer of a first package component; patterning the treating mask to expose first portions of the first surface dielectric layer; performing a selective plasma treatment on the first portions of the first surface dielectric layer that are exposed through the treating mask to form first treated portions; removing the treating mask; and bonding a second surface dielectric layer in a second package component to the first surface dielectric layer. In an embodiment, the selective plasma treatment is performed using a process gas selected from the group consisting of nitrogen ($N_2$), oxygen ($O_2$), argon, and combinations thereof.

In an embodiment, the first package component comprises a wafer that comprises a plurality of dies, and wherein the first treated portions in each of the plurality of dies have a same pattern as patterns of the first treated portions in other dies among the plurality of dies. In an embodiment, the method further comprises activating the first surface dielectric layer using a forming gas comprising ($N_2$) and hydrogen ($H_2$), wherein the selective plasma treatment is performed before the activating. In an embodiment, the method further comprises activating the first surface dielectric layer using a forming gas comprising ($N_2$) and hydrogen ($H_2$), wherein the selective plasma treatment is performed after the activating.

In an embodiment, the selective plasma treatment is performed with a bias power. In an embodiment, the first treated portions have widths in a range between about 1 μm and about 20 μm, and pitches in a range between about 1 μm and about 100 μm. In an embodiment, the method further comprises, after the selective plasma treatment, performing a vacuum break to expose the first package component to air, wherein the vacuum break results in the first treated portions of the first surface dielectric layer to have an increased oxygen atomic percentage.

In an embodiment, the method further comprises performing an additional selective plasma treatment on the second portions of the second surface dielectric layer to form second treated portions. In an embodiment, after the bonding, one of the first treated portions is bonded to one of the second treated portions.

In accordance with some embodiments, a structure comprises a first package component comprising a first surface dielectric layer that further comprises first portions extending from a surface of the first surface dielectric layer into the first surface dielectric layer, wherein the first portions have a first oxygen atomic percentage; and second portions separating the first portions from each other, wherein the second portions have a second oxygen atomic percentage lower than the first oxygen atomic percentage. In an embodiment, the first package component comprises a die, and wherein the first portions have shapes of a plurality of rings, with outer rings encircling respective inner rings.

In an embodiment, the first portions have widths in a range between about 1 μm and about 20 μm, and wherein the first portions have pitches in a range between about 1 μm and about 100 μm. In an embodiment, the structure further comprises a second package component comprising a second surface dielectric layer, wherein the second surface dielectric layer is bonded to the first surface dielectric layer.

In an embodiment, the first portions extend into the first surface dielectric layer for a depth smaller than about 100 Å. In an embodiment, the first portions have a thickness smaller than about 100 Å.

In accordance with some embodiments, a structure comprises a device die comprising a silicon-containing dielectric layer that further comprises first portions extending from a top surface of the silicon-containing dielectric layer to an intermediate level between the top surface and a bottom surface of the silicon-containing dielectric layer; and second portions extending from the top surface to the bottom surface, wherein the first portions have a higher oxygen atomic percentage than the second portions. In an embodiment, the first portions have thicknesses smaller than about 100 Å. In an embodiment, the first portions form a plurality of rings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a patterned treating mask over a first surface dielectric layer of a first package component, wherein first portions of the first surface dielectric layer are exposed through the patterned treating mask;

performing a selective plasma treatment on the first portions of the first surface dielectric layer that are exposed through the patterned treating mask to form first treated portions;

removing the patterned treating mask; and bonding a second surface dielectric layer in a second package component to the first surface dielectric layer.

2. The method of claim 1, wherein the selective plasma treatment is performed using a process gas selected from the group consisting of nitrogen ($N_2$), oxygen ($O_2$), argon, and combinations thereof.

3. The method of claim 1, wherein the first package component comprises a wafer that comprises a plurality of dies, and wherein the first treated portions in each of the plurality of dies have a same pattern as patterns of the first treated portions in other dies among the plurality of dies.

4. The method of claim 1 further comprising activating the first surface dielectric layer using a forming gas comprising nitrogen ($N_2$) and hydrogen ($H_2$).

5. The method of claim 4, wherein the selective plasma treatment is performed after the activating.

6. The method of claim 1, wherein the selective plasma treatment is performed with a bias power.

7. The method of claim 1, wherein the first treated portions have widths in a range between about 1 μm and about 20 μm, and pitches in a range between about 1 μm and about 100 μm.

8. The method of claim 1 further comprising, after the selective plasma treatment, performing a vacuum break to expose the first package component to air, wherein the vacuum break results in the first treated portions of the first surface dielectric layer to have an increased oxygen atomic percentage.

9. The method of claim 1 further comprising performing an additional selective plasma treatment on second portions of the second surface dielectric layer to form second treated portions.

10. The method of claim 9, wherein after the bonding, one of the first treated portions is bonded to one of the second treated portions.

11. A method comprising:

forming a first package component comprising:

forming a first surface dielectric layer comprising:

forming first portions extending from a surface of the first surface dielectric layer into the first surface dielectric layer, wherein the first portions have a first oxygen atomic percentage, wherein the forming the first portions comprises a treatment process using a process gas comprising oxygen; and forming second portions separating the first portions from each other, wherein the second portions have a second oxygen atomic percentage lower than the first oxygen atomic percentage.

12. The method of claim 11, wherein during the treatment process, the first portions are exposed, and the second portions are covered by a treatment mask.

13. The method of claim 11, wherein the first package component comprises a die, and wherein the first portions have shapes of a plurality of rings, with outer rings encircling respective inner rings.

14. The method of claim 11, wherein the first portions have widths in a range between about 1 μm and about 20 μm, and wherein the first portions have pitches in a range between about 1 μm and about 100 μm.

15. The method of claim 11 further comprising bonding a second package component to the first package component, wherein the second package component comprises a second surface dielectric layer, and the second surface dielectric layer is bonded to the first surface dielectric layer.

16. The method of claim 11, wherein the first portions are treated as extending into the first surface dielectric layer for a depth smaller than about 100 Å.

17. The method of claim 11, wherein the first portions have a thickness smaller than about 100 Å.

18. A method comprising:

forming a device die comprising:

forming a silicon-containing dielectric layer comprising:

forming first portions extending from a top surface of the silicon-containing dielectric layer to an intermediate level between the top surface and a bottom surface of the silicon-containing dielectric layer, wherein the first portions are in second portions, and the second portions extend from the top surface to the bottom surface, wherein the first portions have a higher oxygen atomic percentage than the second portions.

19. The method of claim 18, wherein the forming the first portions comprises performing a selective treatment process using an oxygen-containing process gas, and wherein during the selective treatment process, the second portions are masked from being treated.

20. The method of claim 18, wherein the first portions form a plurality of rings.

* * * * *